US010137851B2

(12) United States Patent
Rytkönen et al.

(10) Patent No.: US 10,137,851 B2
(45) Date of Patent: Nov. 27, 2018

(54) MEMS SENSOR AND A SEMICONDUCTOR PACKAGE

(71) Applicant: MURATA MANUFACTURING CO., LTD., Nagaokakyo-shi, Kyoto (JP)

(72) Inventors: Ville-Pekka Rytkönen, Klaukkala (FI); Matti Liukku, Helsinki (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 117 days.

(21) Appl. No.: 14/948,503

(22) Filed: Nov. 23, 2015

(65) Prior Publication Data

US 2016/0152202 A1    Jun. 2, 2016

(30) Foreign Application Priority Data

Dec. 1, 2014 (FI) ...................... 20146052

(51) Int. Cl.
*B60R 21/01* (2006.01)
*B81B 7/02* (2006.01)
(Continued)

(52) U.S. Cl.
CPC ............... *B60R 21/01* (2013.01); *B81B 7/02* (2013.01); *G01P 15/125* (2013.01); *G01P 15/13* (2013.01);
(Continued)

(58) Field of Classification Search
CPC ........ G01P 15/125; G01P 15/13; G01P 15/18; G01P 2015/0817; B81B 2201/0235;
(Continued)

(56) References Cited

U.S. PATENT DOCUMENTS 4,969,359 A * 11/1990 Mikkor ............... G01P 15/0802
338/46
5,083,466 A    1/1992 Holm-Kennedy et al.
(Continued)

FOREIGN PATENT DOCUMENTS

CN    103999364 A    8/2014
EP    0 981 052 A2    2/2000
(Continued)

OTHER PUBLICATIONS

Taiwanese Search Report application No. 104136976 dated Sep. 14, 2016.
(Continued)

*Primary Examiner* — Harshad R Patel
*Assistant Examiner* — Punam Roy
(74) *Attorney, Agent, or Firm* — Squire Patton Boggs (US) LLP

(57) ABSTRACT

The MEMS sensor of the invention has movable and fixed components for measuring acceleration in a rotational mode in a direction in-plane perpendicular to spring axis. The components include an element frame, a substrate, a proof-mass a spring connected to the proof-mass and to the substrate, and comb electrodes. The MEMS sensor is mainly characterized by an arrangement of the components causing an inherent sensitivity for measuring accelerations in a range covering longitudinal and transversal accelerations. One or more of the components are tilted compared to the element frame. The semiconductor package of the invention comprises at least one MEMS sensor.

20 Claims, 2 Drawing Sheets

(51) Int. Cl.
    *G01P 15/18*     (2013.01)
    *G01P 15/125*    (2006.01)
    *G01P 15/13*     (2006.01)
    *G01P 15/08*     (2006.01)

(52) U.S. Cl.
    CPC .... *G01P 15/18* (2013.01); *B60R 2021/01286* (2013.01); *B81B 2201/0235* (2013.01); *B81B 2201/033* (2013.01); *B81B 2203/0154* (2013.01); *B81B 2203/0163* (2013.01); *B81B 2207/015* (2013.01); *G01P 2015/0817* (2013.01)

(58) Field of Classification Search
    CPC ...... B81B 2201/033; B81B 2203/0154; B81B 2203/0163; B81B 2207/015; B81B 7/02
    See application file for complete search history.

(56) References Cited

U.S. PATENT DOCUMENTS

| | | | | |
|---|---|---|---|---|
| 6,705,167 | B2* | 3/2004 | Kvisteroey | G01P 1/003 73/514.33 |
| 7,194,376 | B2* | 3/2007 | Zarabadi | G01P 15/125 702/127 |
| 8,165,323 | B2* | 4/2012 | Zhou | H01G 5/011 257/415 |
| 8,739,626 | B2* | 6/2014 | Acar | G01C 19/5712 73/504.04 |
| 8,936,959 | B1* | 1/2015 | Yang | B81C 1/00238 438/48 |
| 9,157,740 | B2* | 10/2015 | Kempe | G01C 19/5747 |
| 9,376,312 | B2* | 6/2016 | Koury, Jr. | B81C 1/00142 |
| 9,377,487 | B2* | 6/2016 | Koury, Jr. | G01P 15/125 |
| 2008/0192406 | A1 | 8/2008 | Despesse et al. | |
| 2010/0001616 | A1* | 1/2010 | Ferreira | H02N 1/008 310/300 |
| 2013/0031977 | A1* | 2/2013 | Kempe | G01C 19/5747 73/504.04 |
| 2013/0154742 | A1 | 6/2013 | Samuels | |
| 2013/0263663 | A1 | 10/2013 | Zhang | |
| 2014/0021829 | A1 | 1/2014 | Kubota et al. | |
| 2016/0377649 | A1* | 12/2016 | Rytkonen | G01C 9/06 73/514.32 |

FOREIGN PATENT DOCUMENTS

| | | | | |
|---|---|---|---|---|
| JP | 2000097966 | A * | 4/2000 | |
| KR | 20010021258 | A * | 3/2001 | .......... G01P 15/0802 |
| KR | 20020005957 | A * | 1/2002 | .............. G01P 1/003 |
| WO | 2013/090890 | A1 | 6/2013 | |

OTHER PUBLICATIONS

Finnish Search Report dated Jul. 13, 2015 corresponding to Finnish Patent Application No. 20146052.
Ofir Bochobza-Degani et al., "Design and Noise Consideration of an Accelerometer Employing Modulated Integrative Differential Optical Sensing", Sensors and Actuators, vol. 84, No. 1-2, Aug. 1, 2000, pp. 53-64.
Shamus McNamara et al., "LIGA Fabricated 19-Element Threshold Accelerometer Array", Sensors and Actuators, vol. 112, No. 1, Apr. 15, 2004, pp. 175-183.
International Search Report application No. PCT/IB2015/059062 dated Mar. 4, 2016.
Taiwanese Search Report corresponding to TW Patent Appln. No. 104136976, dated Apr. 21, 2017.

* cited by examiner

MEMS SENSOR AND A SEMICONDUCTOR PACKAGE

BACKGROUND

Field

The present invention relates to microelectromechanical systems and especially to a MEMS sensor and a semiconductor package including the MEMS sensor.

Description of the Related Art

One common application of MEMS technology is the design and manufacture of inertial sensing devices. In an inertial sensor, like a MEMS accelerometer, internal structures like proof masses, cantilevered beams and/or interdigitated comb fingers can be used to detect changes in motion of the sensor.

The measurement range of an accelerometer is the level of acceleration supported by the sensor's output signal specifications, typically specified in ±g. This is the greatest amount of acceleration the part can measure and accurately represent as an output. The accelerometers are classified as high-g, mid-g or low-g accelerometers depending on their highest output value specified by the full scale range.

Various types of MEMS sensors can be merged on a substrate along with integrated circuits (microelectronics) fabricated by separate process sequences. However, there is a constant need to reduce the size of the combination of sensors and circuits packaged together. For example, there are bi-axial and tri-axial accelerometers that detect inertial movements in two or three directions. Typically they have a separate MEMS element for detection of accelerations along each axis (x-,y-, and/or z-axis) of detection. The size and cost of such multi-element accelerometers can be excessive for many applications.

As another example, a modern car's airbag system uses acceleration sensors to determine the trigger point for release, and seat belt tensioners may be triggered by accelerometers. MEMS devices, such as accelerometers and gyroscopes, can also be used as sensors in Electronic Stability Control (ESC) technology to minimize the loss of car steering control in cars. In the future, ESC sensors are more and more integrated into the same location with the control unit and accelerometer of the airbag system. There is thus a need to integrate the low-g accelerometer and the gyroscope used as ESC sensors with the mid-g accelerometer of the airbag system to reduce component size and costs.

The mid-g accelerometer of the airbag system is often a 2-axis MEMS sensor that is sensitive to both longitudinal and transverse acceleration directions of a car. Conventionally such sensitivity has been achieved by mounting the whole mid-g accelerometer in a 45° angle on the printed circuit board the sensor is fabricated on. However, in integrated systems, the package size needs to be compact, so it is no longer feasible to mount the mid-g accelerometer in a 45° angle with respect to the ESC sensors.

SUMMARY

Embodiments of the present invention disclose a novel sensor configuration that measures accelerations in the longitudinal direction and in the transversal direction, and at the same time enables compact integration with other components that have a rectangular form with sides in the longitudinal and in the transversal directions.

Embodiments of the invention can include a MEMS sensor for measuring acceleration. The sensor comprises a substrate, an element frame, a spring anchor, a proof-mass, and a flexural spring. The element frame and the spring anchor are rigidly fixed to the substrate, and one end of the spring is connected to the proof-mass and an opposite end of the spring is connected to the spring anchor. In a non-flexed state of the spring, a spring access extends between the opposite ends of the spring. The proof mass and the spring extend along a common plane, and the spring suspends the proof-mass to a rotary mode of motion in the common plane. The element frame comprises a rectangular form such that in the common plane, an outer surface of the element frame has four sides, of which two longitudinal sides run in parallel in a longitudinal direction, and two transversal sides run in parallel in a transversal direction, when the transversal direction is perpendicular to the longitudinal direction. The rectangular form of the element frame includes a first longitudinal side, and a first transversal side, connected by a first vertex that is closest to the spring anchor. The spring access forms an acute angle with the first longitudinal side and with the first transversal side, thereby causing an inherent sensitivity for measuring accelerations in a range covering accelerations in the longitudinal direction and in the transversal direction.

Further advantages achievable with the invention are discussed in more detail with the embodiments as defined in the dependent claims and in the following detailed description.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with simple examples of a device architecture in which various embodiments of the invention may be implemented. Only elements relevant for illustrating the embodiments are described in detail. Various implementations of microelectromechanical sensors that are generally known to a person skilled in the art may not be specifically described herein.

Figure 1:
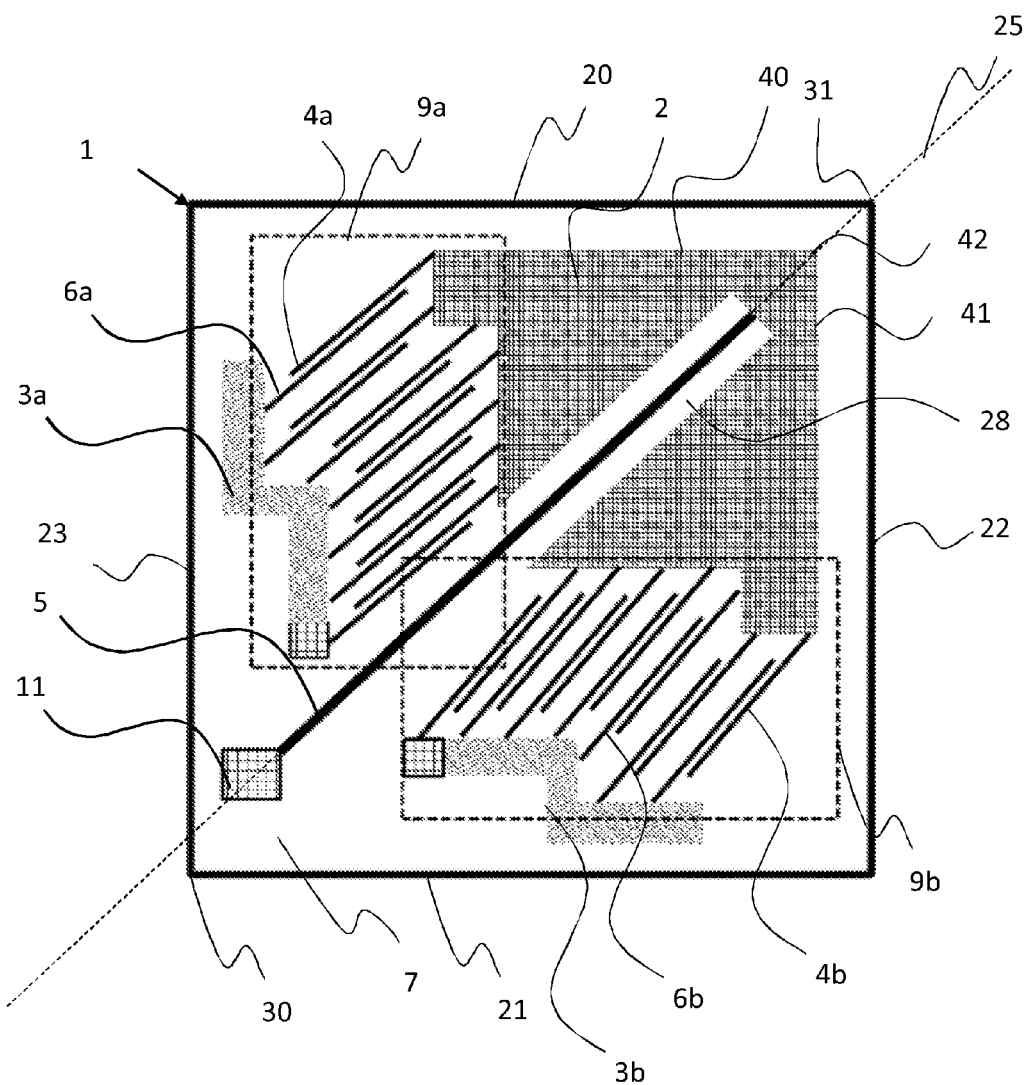
FIG. 1 is a schematic cross-sectional view of a MEMS acceleration sensor.

FIG. 1 is a simplified schematic cross-sectional view of a MEMS acceleration sensor. The MEMS acceleration sensor includes movable and fixed components that are configured to measure acceleration. The principle of acceleration sensing is simple and reliable: inertia of a moving body is converted into force according to Newton's second law. The basic elements of the accelerometer are the spring, the proof mass and the surrounding support structures. The spring connects the mass to the support. When the speed of the sensor changes, the proof mass is forced to follow the change via the spring coupling. A force is needed to change the motion of the proof mass. Due to this force the spring deflects and the position of the proof mass changes in proportion to the acceleration. In a capacitive sensor, the support and the proof mass are insulated from each other, and their capacitance, or charge storage capacity, is measured. The sensor converts the acceleration of the body into an electric current, charge or voltage. In piezoelectrical detection, flexure of the spring may be sensed with piezoelectrical layers on it.

The components of the MEMS sensor in FIG. 1 include a substrate 7, an element frame 1, a spring anchor 11, a proof-mass 2 and a flexural spring 5.

The substrate 7 refers here to a bottom layer of the MEMS device and shows in FIG. 1 as a blank background for the patterned components of a device layer. Typically the substrate includes a silicon layer separated from the device layer by an insulating layer. For example, many MEMS devices may be manufactured from layered solid structures, like silicon-on-insulator (SOI) or cavity-silicon-on-insulator (cavity-SOI) wafers. A SOI-wafer typically comprises a handle wafer layer, a buried oxide (BOX) layer, and a device layer. The handle wafer layer is usually the thickest part, some hundreds of micron thick, while the device layer is typically tens of microns thick. The BOX layer is typically from fraction of a micron to a few microns thick. The BOX layer may be deposited either on the handle wafer or the device layer and the two pieces of silicon may be bonded to each other so that the BOX layer is in between them and enables isolation of the device layer components electrically from the handle wafer.

The element frame 1 represents here a solid mechanical element that is rigidly fixed to the substrate 7. The role of the element frame 1 is to form side walls that circumscribe the components in the device layer, thereby hermetically enclosing the internal cavities and mechanically bracing the element layer structure. Let us consider a plane of the cross-section, i.e. a plane crossing the patterned components of the device layer in FIG. 1 as a common plane. The element frame 1 may have a rectangular form such that in the common plane, an outer surface of the element frame forms four sides, of which two longitudinal sides 20, 21 run in parallel in a longitudinal direction, and two transversal sides 22, 23 run in parallel in a transversal direction, when the transversal direction is perpendicular to the longitudinal direction. It is noted that the terms transversal and longitudinal are used here for simple referencing to the attached drawings, and to possible directions of measurable accelerations in potential applications. Within the scope, any two orthogonal in-plane directions of a MEMS structure are applicable as the transversal direction and the longitudinal direction.

These sides may be aligned to the outer sides of the substrate 7, and other possible layers of the chip, such that the peripheral dimensions of the MEMS sensor in the presented view are by far aligned to, or defined by the peripheral dimensions of the element frame 1. Accordingly, in view of integrating the MEMS sensor to a same chip with other rectangular formed chips, the dimensions that define the chip area to be occupied by the MEMS sensor may be by far dependent on the dimensions of the longitudinal and transversal sides of the element frame 1.

The spring anchor 11 represents here a point of connection between the element layer and the substrate 7. The spring anchor 11 is rigidly fixed to the substrate 7 and provides a fixed starting point to the flexural spring 5. In the example of FIG. 1, a beam spring is shown. Other flexural spring types, for example, meandering springs or folded springs, can be applied within the scope, as well. One end of the spring 5 is connected to the spring anchor 11, and the other end of the spring 5 is coupled to the proof mass 2 so that the spring 5 provides a flexural coupling that flexibly suspends the proof mass 2 through the spring anchor 11 to the substrate 7. The proof-mass 2 and the spring 5 extend along the common plane. FIG. 1 shows the structure in a non-flexed state of the spring, i.e. in the state when the MEMS sensor is manufactured and ready to operate, but experiences no measured accelerations. A spring axis 25 of the MEMS sensor extends between the opposite ends of the spring in said non-flexed state. The spring is advantageously flexural and bends when subjected to forces applied in in-plane direction (parallel to the common plane) and perpendicular to the spring axis (sense direction). The spring 5 is advantageously as rigid as possible in any other directions.

In the element frame, let us denote a vertex 30 that is closest to the spring anchor 11 as a first vertex. In the rectangular form of the element frame 1, a first longitudinal side 21, and a first transversal side 23 are then sides of the rectangular form of the element frame 1, connected by the first vertex 30. The orientation of the device layer elements has now been arranged to be such that the spring axis 25 forms an acute angle both with the first longitudinal side 21, and with the first transversal side 23. Accordingly, when the proof mass 2 displaces because of measured accelerations, the deformation of the spring transforms the displacements of the proof-mass 2 to a rotary mode of motion in the common plane. The axis of rotation of the rotary mode of motion is perpendicular to the common plane (out-of-plane direction). Due to the specific orientation of the elements, this rotary mode of motion may thus be induced by accelerations in longitudinal directions, as well as by accelerations in the transversal directions, as long as they have a component in the direction perpendicular to the spring axis 25. It is, however, evident that of the total acceleration vector, only the component in the sense direction becomes measured by the structure. The arrangement of the components causes an inherent sensitivity for measuring accelerations in a range covering accelerations in the longitudinal direction and in the transversal direction. However, the external dimensions that extend in the longitudinal and transversal directions, allow the MEMS sensor to be positioned compactly side by side into a same package with other rectangular components with sides that extend in the longitudinal and transversal directions.

In the exemplary configuration of FIG. 1, measurement of accelerations is based on capacitive detection, without restricting the scope to capacitive detection only. For the capacitive sensing, the MEMS sensor may include one or more comb capacitors configured for measuring accelerations. Each comb capacitor 9a, 9b may include a set of rotor comb fingers 4a, 4b that are coupled to move with the proof-mass 2, and a set of stator comb fingers 6a, 6b rigidly fixed to the substrate 7. In each of the comb capacitors 9a, 9b, a set of rotor comb fingers 4a, 4b may extend from the movable proof-mass 2, and a set of stator comb fingers 6a, 6b may extend from rigid stator bars 3a, 3b. The stator bars 3a, 3b may be anchored to the substrate 7 and be electrically insulated from each other. Each pair of comb fingers, formed of a rotor comb finger of the set of rotor comb fingers 4a, 4b and of an adjacent stator comb finger of the set of stator comb fingers 6a, 6b thus forms a separate parallel plate capacitor.

In the configuration of FIG. 1, the structure includes two comb capacitors 9a, 9b. The output of a comb capacitor 9a corresponds to the total of the parallel plate capacitors formed by the set of rotor comb fingers 4a and the set of stator comb fingers 6a, and the output of a comb capacitor 9b corresponds to the total of the parallel plate capacitors formed by the set of rotor comb fingers 4b and the set of stator comb fingers 6b. The comb capacitors 9a, 9b thus form two capacitances that simultaneously vary with the rotary mode of motion of the proof mass. The pair of capacitances can be used to provide a differential output signal sx that corresponds to displacements of the proof mass in the common plane:

$$sx=s(9a)-s(9b)$$

wherein s(9a) represents a signal output from the comb capacitor 9a, and s(9b) represents a signal output from the comb capacitor 9b. The differential detection effectively cancels out potential common error shifts in the capacitances of comb capacitors.

In the exemplary configuration of FIG. 1, the spring axis 5 is diagonal such that it forms an acute 45° angle with the first longitudinal side 21 and with the first transversal side 23 of the element frame 1. It is easily understood from FIG. 1 that an external acceleration, which is not in the direction of the spring axis, or perpendicular to it, has a component in the longitudinal direction and in the transversal direction, and is therefore capable of inducing the proof mass into the rotary mode of motion. The configuration thus makes a MEMS sensor that has a rectangle form exterior sensitive to accelerations in directions of both of its perpendicular peripheral sides. The diagonal orientation of the spring axis is advantageous, since it enables balance through symmetry and use of a long flexure, advantages of which will be discussed in more detail later on. However, other acute angles, for example angles between 40-50°, or even between 35-55°, may be applied, as well.

Accordingly, in the configuration of FIG. 1, the stator comb fingers 6a, 6b form a first acute angle with the first longitudinal side 21 and with the first transversal side 23 of the element frame 1, and the rotor comb fingers 4a, 4b form a second acute angle with the first longitudinal side 21 and with the first transversal side 23 of the element frame 1. The first acute angle and the second acute angle may be equal, as shown in FIG. 1, where the first acute angle and the second acute angle are acute 45° angles, and also the spring axis 5 forms an acute 45° angle with the first longitudinal side 21 and with the first transversal side 23 of the element frame 1.

On the other hand, the first acute angle and the second acute angle may be different. One possible drawback of the rotational mode over the conventional in-plane linear mode of motion of the proof mass is that when the linear rotor comb fingers move in the in-plane rotational mode, a minuscule angle tends to form between the rotor comb fingers and the stator comb fingers. To minimize potential linearity errors, the MEMS sensor may be designed with slanted (or tilted) comb fingers such that in the initial non-flexed state, the stator comb fingers and rotor comb fingers are not parallel, but slightly tilted in respect of each other. The stator comb fingers and rotor comb fingers may be arranged to become parallel in maximum displacement (max full scale) or e.g. in half of the maximum displacement (½ of full scale), with which non-linearity is compensated for. The angle between the fingers in the initial state may be determined case by case on the basis of a given full- or half-scale requirement, and the related maximum displacements. Accordingly, in view of FIG. 1, there may be an initial difference between the first acute angle and the second acute angle. The difference may be adjusted to be eliminated when the rotor comb fingers 4a, 4b become parallel to the stator comb fingers 6a, 6b at maximum displacement, or half of the maximum displacement in the rotary mode of motion of the proof-mass 2.

One source of errors in a MEMS-type inertial sensor results from oscillations of the proof mass in vibrational modes, which are different from the desired sense mode. Ideally, a capacitive inertial MEMS sensors would behave as a mass-damper-spring system, with a single damped resonant frequency. However, in reality, A MEMS sensor is a complex element that tends to have additional parasitic resonant modes also in non-desired directions. These parasitic modes can lead to instability of the sensor. The desired measurement mode is called the first mode. The other modes, i.e. the second ($2^{nd}$) mode, the third ($3^{rd}$) mode, etc., are parasitic modes and should preferably have a higher frequency than the frequency of the first mode, in order not to disturb the measurement.

Spring constants of the first, second and third modes may be determined from equations (1)-(3), respectively:

$$k_1 = Ew^3h/4l^3, \qquad (1)$$

$$K = Gw^3h/3l, \qquad (2)$$

$$k_2 = Ewh^3/4l^3, \qquad (3)$$

wherein $k_1$ is the spring constant in the measurement mode ($1^{st}$ mode)

K is the spring constant in a non-desired resonance mode ($2^{nd}$ mode)

$k_2$ is the spring constant in another non-desired resonance mode ($3^{rd}$ mode)

h is the height (out-of-plane direction) of the spring, l is the length of the spring, when measured between the point of connection to the spring anchor and the point of connection to the proof mass w is the width (in-plane direction) of the spring, and E and G are Young's modulus and shear modulus.

The design of the sensor can be optimized by configuring the spring dimensions so that equations (4) and (5) are maximized. This means that the value of $k_1$ should be as small as possible, whereas K and $k_2$ should be large.

$$K/k_1 = 4Gl^2/3E \qquad (4)$$

$$k_2/k_1 = h^2/w^2 \qquad (5)$$

Accordingly, in a design that is optimized in view of equations (4) and (5), the spring length (l) should be as large as possible, the spring width (w) as small as possible and the spring height (h) as large as possible, within the limitations of the manufacturing process and the desired frequency of the measurement mode ($1^{st}$ mode).

In the configuration of FIG. 1, the length of the spring has been maximized by designing it to extend along the longest diagonal dimension of the rectangle, and even partly inside a triangle-like proof-mass positioned close to one corner of the element frame, while the other end of the spring is anchored to the opposite corner of the element frame. The triangle-like proof-mass means that the proof mass includes a corner section that can be aligned with the corner of the element frame. More specifically, the proof-mass 2 may have a polygon form in which two adjacent side segments 40, 41 form a right angle. One of the adjacent side segments 40 may be parallel to the longitudinal direction, and the other one of the adjacent side segments 41 parallel to the transversal direction. When the proof mass is positioned close to the corner of the element frame, a corner vertex 42 between these adjacent side segments 40, 41 is closest to a second vertex 31 of the element frame. The second vertex 31 is a vertex opposite to the first vertex 30 in the rectangular form of the element frame 1. When the spring 5 runs inside the proof mass 2, at least part of a side surface of the proof-mass runs closer to the first vertex 30 than a point of connection of the spring to the proof-mass. This can be implemented, for example, by the proof-mass including a cut-out 28, within which the spring 50 extends to the point of connection to the proof mass, but is separated from the proof mass by a thin gap.

In view of the equations (4) and (5), in the configuration of FIG. 1, the parasitic vibration modes may be kept as high as possible by, for example, allowing the spring 5 to employ the maximum height of the device layer and the maximum length within the rectangular form of the element frame, while the spring width is designed with the proof mass dimensions to configure the system to a desired measurement range.

Even if parasitic resonance modes can be designed to have high spring constants, all modes, i.e. the measurement mode and the parasitic modes of mid-g sensors should be highly damped to avoid vibration issues. In the invention, this can be done by high gas pressure and a shallow out-of-plane gap to a capping wafer. Also the gaps between rotor and stator fingers may be kept small. With these measures, all other modes but an in-plane mode along the diagonal spring axis 25 are typically highly damped. This non-damped mode is, however, a bulk mode that has inherently a very high spring constant compared to the measurement mode:

$$k_3 = Ewh/l, \quad (6)$$

$$k_3/k_1 = 4l^2/w^2 \quad (7)$$

wherein
$k_1$ is the spring constant in the measurement mode ($1^{st}$ mode)
$k_3$ is the spring constant in another non-desired resonance mode (4th mode).

In a parallel plate capacitor, capacitance is proportional to the area of overlap and inversely proportional to the separation between two capacitor plates. Parallel plate capacitors can be used to create closing gap structures, or area modulated structures, or a hybrid of them. In closing gap structures, capacitor plates move towards and away from each other. Typically one of the plates is stationary (stator), and the other plate (rotor) moves closer to and further away from the stationary plate. The capacitance behavior can then be approximately modeled with equation (1)

$$C = \epsilon \frac{A}{d-x} + C_f \quad (1)$$

where C is the capacitance, $\epsilon$ is permittivity, A an overlap area between the plates, d an initial gap between the plates, x a displacement from the initial gap position, and $C_f$ a static stray capacitance.

In the exemplary configuration of FIG. 1, the parallel plate capacitors can be considered to be closing gap structures. This means that the measured capacitance of the capacitors varies mainly according to the width of the gap between the comb fingers. The parallel plate capacitors of the one or more comb capacitors may be configured so that each stator comb finger extending from it is equally long, which is desirable so that they would be equally rigid and have the same (parasitic) resonance frequencies. This may be achieved by means of a specific form of the proof mass and correspondingly formed stator bars 3a, 3b. Advantageously the comb fingers of the comb capacitors have the same area of overlap, at least in the non-flexed state of the spring. FIG. 1 shows one example of how to construct the fingers to have the same length. Other possible designs may be applied within the scope.

In the configuration of FIG. 1, the proof-mass 2 has a staggered polygon form and the rotor comb fingers 4a, 4b extend towards the stator comb fingers 6a, 6b from at least three side segments of the proof-mass 2. Also the stator bars 3a, 3b have a polygon form that matches with the side segments of the proof-mass 2 such that the parallel plate capacitors of the one or more comb capacitors have the same area of overlap, and the comb fingers of each comb capacitor 9a, 9b have the same length.

The first rigid stator bar 3a is anchored to the substrate 7 with a stator anchor 8a and the second rigid stator bar 3b is anchored to the substrate 7 with another stator anchor 8b. The distance from the stator anchors 8a, 8b to the spring anchor 11 may be adjusted to be less than half of the smaller of the first longitudinal side 21 and the first transversal side 23. In this way, the anchoring points of the rotor comb fingers 4a, 4b and stator comb fingers 6a, 6b to the substrate 7 are close to each other, which improves the robustness of the sensor against external stresses.

Figure 2:
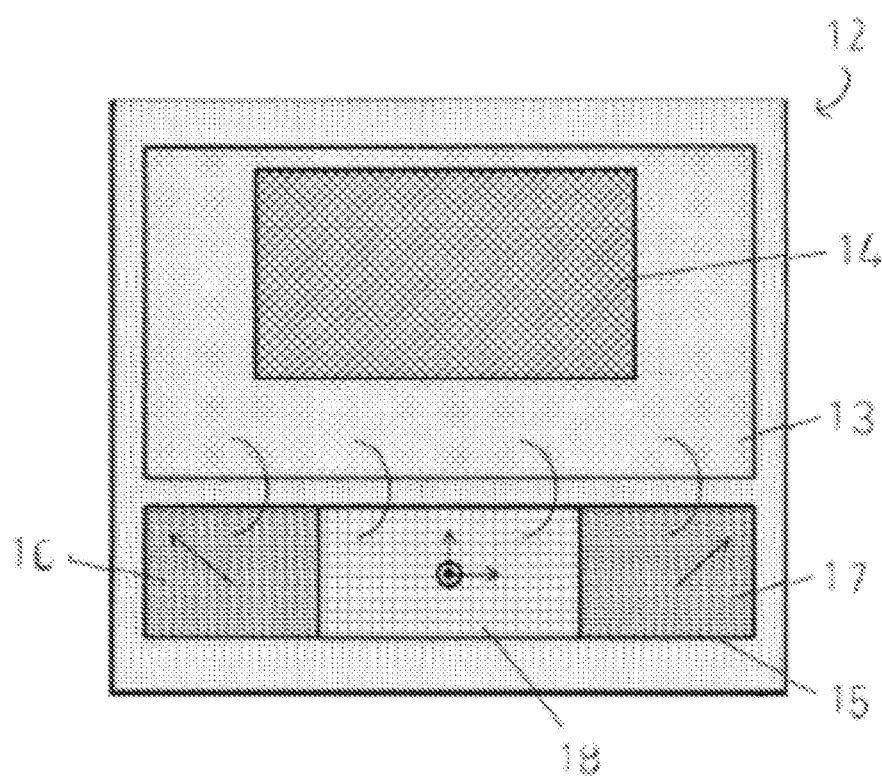
FIG. 2 is a schematic cross-sectional view of a semiconductor package comprising the MEMS acceleration sensor of FIG. 1.

FIG. 2 is a schematic cross-sectional view of a semiconductor package comprising at least one MEMS sensor as described above. In prior art solutions, there typically is a separate MEMS element for each measurement axis. For example, airbag electronic systems measure various sensor signals and control several different actuators in an effort to prevent passenger injuries in case of accidents. In these systems, accelerometers and gyros are used provide the ability to measure arbitrary motion and position. There is often a need to integrate a low-g accelerometer and a gyroscope used as ESC sensors with a mid-g accelerometer of the airbag system to reduce size and costs.

The package 12 of FIG. 2 shows a semiconductor package that includes an Application-Specific Integrated Circuit (ASIC) 13 constructed for the airbag system, and a MEMS gyroscope 14 for measuring rotational motion. Two mid-g accelerometers 16 and 17 of the invention and one 3-axis low-g accelerometer 18 may be fabricated, compactly side by side, on a single die 15 and included in the package 12. The die 15 may be connected to the ASIC 13.

It is apparent to a person skilled in the art that as technology advances, the basic idea of the invention can be implemented in various ways. The invention and its embodiments are therefore not restricted to the above examples, but they may vary within the scope of the claims.

The invention claimed is:
1. A MEMS sensor for measuring acceleration, said MEMS sensor comprising:
   a substrate;
   an element frame;
   a spring anchor;
   a proof-mass; and
   a spring,
   wherein the element frame and the spring anchor are rigidly fixed to the substrate,
   wherein one end of the spring is connected to the proof-mass and an opposite end of the spring is connected to the spring anchor,
   wherein in a non-flexed state of the spring, a spring axis extends between the opposite ends of the spring,
   wherein the proof-mass and the spring extend along a common plane, whereby the spring suspends the proof-mass to a rotary mode of motion in the common plane,
   wherein the element frame comprises a rectangular form such that in the common plane, an outer surface of the element frame has four sides, of which two longitudinal sides run in parallel in a longitudinal direction, and two transversal sides run in parallel in a transversal direction, wherein the transversal direction is perpendicular to the longitudinal direction, wherein the rectangular form of the element frame includes a first longitudinal side and a first transversal side, connected by a first vertex that is closest to the spring anchor, and wherein the spring axis forms an acute angle with the first longitudinal side and with the first transversal side, the spring is flexural and bends when subjected to forces in the in-plane direction perpendicular to the spring axis, and the spring is rigid when subjected to forces in any other direction, thereby causing an inherent sensitivity for measuring accelerations in a range covering accelerations in the longitudinal direction and in the transversal direction, and wherein the sensor further comprises one or more comb capacitors configured to measure the accelerations, wherein each comb capacitor includes a set of rotor comb fingers coupled to move with the proof-mass and a set of stator comb fingers rigidly fixed to the substrate.

2. The MEMS sensor of claim 1, wherein the spring axis forms an acute 45° angle with the first longitudinal side and with the first transversal side of the element frame.

3. The MEMS sensor of claim 1, wherein the spring comprises a beam, or a meandering spring.

4. The MEMS sensor of claim 1, wherein at least part of a side surface of the proof-mass runs closer to the first vertex than a point of connection of the spring to the proof-mass.

5. The MEMS sensor of claim 4, wherein the proof-mass includes a cut-out within which the spring extends to the point of connection.

6. The MEMS sensor of claim 5, wherein the proof-mass comprises a polygon form in which two adjacent side segments form a right angle, one of the adjacent side segments being parallel to the longitudinal direction, and the other one of the adjacent side segments being parallel to the transversal direction, and a corner vertex between the adjacent side segments is closest to a second vertex, wherein the second vertex is opposite to the first vertex in the rectangular form of the element frame.

7. The MEMS sensor of claim 1, wherein each rotor comb finger of the set of rotor comb fingers forms a parallel plate capacitor with a stator comb finger of the set of stator comb fingers adjacent to it.

8. The MEMS sensor of claim 7, wherein in the non-flexed state of the spring, the parallel plate capacitors of the one or more comb capacitors have the same area of overlap.

9. The MEMS sensor of claim 7, wherein each stator comb finger of the set of stator comb fingers is of the same length.

10. The MEMS sensor of claim 9, wherein
the proof-mass comprises a polygon form and each set of rotor comb fingers extends towards the stator comb fingers from at least three side segments of the proof-mass; and
the stator bars comprise a polygon form that matches with the side segments of the proof-mass such that the parallel plate capacitors of the one or more comb capacitors have the same area of overlap, wherein the stator comb fingers are of the equal length.

11. The MEMS sensor of claim 7, wherein the first set of stator comb fingers are connected to a first rigid stator bar and the second set of stator comb fingers are connected to a second rigid stator bar, wherein stator bars are anchored to the substrate.

12. The MEMS sensor of claim 11, wherein the stator bars are anchored to the substrate with stator anchors, and the distance from the stator anchors to the spring anchor is less than half of the smaller of the first longitudinal side and the first transversal side.

13. The MEMS sensor of claim 1, further comprising a pair of comb capacitors comprising a first comb capacitor with first rotor comb fingers and first stator comb fingers and a second comb capacitor with second rotor comb fingers and second stator comb fingers, the pair of comb capacitors being configured for differential detection.

14. The MEMS sensor of claim 1, wherein the stator comb fingers form a first acute angle with the first longitudinal side and with the first transversal side of the element frame, and the rotor comb fingers form a second acute angle with the first longitudinal side and with the first transversal side of the element frame.

15. The MEMS sensor of claim 14, wherein the first acute angle and the second acute angle are the same.

16. The MEMS sensor of claim 15, wherein the first acute angle and the second acute angle are acute 45° angles, and wherein the spring axis forms an acute 45° angle with the first longitudinal side and with the first transversal side of the element frame.

17. The MEMS sensor of claim 14, wherein the first acute angle and the second acute angle are different.

18. The MEMS sensor of claim 17, wherein a difference between the first acute angle and the second acute angle is adjusted to be eliminated by the rotor comb fingers becoming parallel to the stator comb fingers at maximum displacement, or half of the maximum displacement in the rotary mode of motion of the proof-mass.

19. A semiconductor package comprising at least one MEMS sensor for measuring acceleration, said at least one MEMS sensor comprising:
a substrate;
an element frame;
a spring anchor;
a proof-mass; and
a spring,
wherein the element frame and the spring anchor are rigidly fixed to the substrate,
wherein one end of the spring is connected to the proof-mass and an opposite end of the spring is connected to the spring anchor,
wherein in a non-flexed state of the spring, a spring axis extends between the opposite ends of the spring,
wherein the proof-mass and the spring extend along a common plane, whereby the spring suspends the proof-mass to a rotary mode of motion in the common plane,
wherein the element frame comprises a rectangular form such that in the common plane, an outer surface of the element frame has four sides, of which two longitudinal sides run in parallel in a longitudinal direction, and two transversal sides run in parallel in a transversal direction, wherein the transversal direction is perpendicular to the longitudinal direction,
wherein the rectangular form of the element frame includes a first longitudinal side and a first transversal side, connected by a first vertex that is closest to the spring anchor, and
wherein the spring axis forms an acute angle with the first longitudinal side and with the first transversal side, the spring is flexural and bends when subjected to forces in the in-plane direction perpendicular to the spring axis, and the spring is rigid when subjected to forces in any other direction, thereby causing an inherent sensitivity for measuring accelerations in a range covering accelerations in the longitudinal direction and in the transversal direction, and wherein the sensor further comprises one or more comb capacitors configured to measure the accelerations, wherein each comb capacitor includes a set of rotor comb fingers coupled to move with the proof-mass and a set of stator comb fingers rigidly fixed to the substrate.

20. A semiconductor package comprising at least one MEMS sensor for measuring acceleration, said at least one MEMS sensor comprising:

a substrate;
an element frame;
a spring anchor;
a proof-mass; and
a spring, wherein the element frame and the spring anchor are rigidly fixed to the substrate, wherein one end of the spring is connected to the proof-mass and an opposite end of the spring is connected to the spring anchor, wherein in a non-flexed state of the spring, a spring axis extends between the opposite ends of the spring, wherein the proof-mass and the spring extend along a common plane, whereby the spring suspends the proof-mass to a rotary mode of motion in the common plane, wherein the element frame comprises a rectangular form such that in the common plane, an outer surface of the element frame has four sides, of which two longitudinal sides run in parallel in a longitudinal direction, and two transversal sides run in parallel in a transversal direction, wherein the transversal direction is perpendicular to the longitudinal direction, wherein the rectangular form of the element frame includes a first longitudinal side and a first transversal side, connected by a first vertex that is closest to the spring anchor, and wherein the spring axis forms an acute angle with the first longitudinal side and with the first transversal side, the spring is flexural and bends when subjected to forces in the in-plane direction perpendicular to the spring axis, and the spring is rigid when subjected to forces in any other direction, thereby causing an inherent sensitivity for measuring accelerations in a range covering accelerations in the longitudinal direction and in the transversal direction, wherein the semiconductor package is configured for airbag use, the semiconductor package comprising at least two MEMS sensors, with the MEMS sensors being configured as at least one mid-g MEMS accelerometer, and at least one low-g MEMS accelerometer or at least one MEMS gyroscope.

* * * * *